United States Patent
Itkin (10) Patent No.: US 11,223,364 B2
(45) Date of Patent: Jan. 11, 2022

(54) PHASE-LOCKED LOOP CIRCUITRY AND METHOD TO PREVENT FRACTIONAL N SPURIOUS OUTPUTS IN RADAR PHASE-LOCKED LOOP

(71) Applicant: Infineon Technologies AG, Neubiberg (DE)

(72) Inventor: Grigory Itkin, Munich (DE)

(73) Assignee: Infineon Technologies AG

( * ) Notice: Subject to any disclaimer, the term of this patent is extended or adjusted under 35 U.S.C. 154(b) by 99 days.

(21) Appl. No.: 16/676,869

(22) Filed: Nov. 7, 2019

(65) Prior Publication Data
US 2021/0143825 A1    May 13, 2021

(51) Int. Cl.
H03L 7/23       (2006.01)
H03L 7/07       (2006.01)
H03L 7/08       (2006.01)
H03L 7/099      (2006.01)
H03L 7/087      (2006.01)
G01S 13/40      (2006.01)

(52) U.S. Cl.
CPC .............. *H03L 7/23* (2013.01); *G01S 13/40* (2013.01); *H03L 7/07* (2013.01); *H03L 7/0805* (2013.01); *H03L 7/087* (2013.01); *H03L 7/0992* (2013.01); *H03L 2207/50* (2013.01)

(58) Field of Classification Search
CPC ..... H03L 3/00; H03L 3/06; H03L 3/07; H03L 3/08; H03L 3/0805; H03L 3/085; H03L 3/087; H03L 3/099; H03L 3/0991; H03L 3/0992; H03L 3/0993; H03L 3/23; H03L 2207/50

See application file for complete search history.

(56) References Cited

U.S. PATENT DOCUMENTS

| | | | | |
|---|---|---|---|---|
| 5,329,367 A | * | 7/1994 | Fernsler | H04N 3/22 348/500 |
| 2011/0032013 A1 | * | 2/2011 | Nelson | H03L 7/23 327/156 |
| 2019/0334534 A1 | * | 10/2019 | Kitamura | H03B 5/1243 |

OTHER PUBLICATIONS

Brennan, Robert, "Analyzing, Optimizing, and Eliminating Integer Boundary Spurs in Phase-Locked Loops with VCOs at up to 13.6 GHz", Analog Dialogue 49-08, Analog Devices, Aug. 2015, pp. 1-3, [online] URL: <https://www.analog.com/media/en/analog-dialogue/volume-49/number-3/articles/analyzing-integer-boundary-spurs.pdf>.

Barrett, Curtis, "Fractional/Integer-N PLL Basics", Technical Brief SWRA029, Texas Instruments, Aug. 1999, pp. 1-55, [online] URL: <http://www.ti.com/lit/an/swra029/swra029.pdf>.

\* cited by examiner

*Primary Examiner* — Diana J. Cheng
(74) *Attorney, Agent, or Firm* — Design IP (57) ABSTRACT

A signal generator includes a first phase-locked loop (PLL) configured to receive a first reference signal having a first reference frequency and generate a ramping signal based on the first reference signal, where the ramping signal is between a minimum frequency and a maximum frequency of a radar frequency band; a system clock configured to generate a second reference signal having a common system reference frequency; and a second PLL configured to receive the second reference signal from the system clock, generate the first reference signal based on the second reference signal, and provide the first reference signal to the first PLL.

26 Claims, 9 Drawing Sheets

PHASE-LOCKED LOOP CIRCUITRY AND METHOD TO PREVENT FRACTIONAL N SPURIOUS OUTPUTS IN RADAR PHASE-LOCKED LOOP

FIELD

The present disclosure relates to the field of radio frequency (RF) circuits, and particularly to a phase-locked loop circuit.

BACKGROUND

Modern radar devices such as radar range and velocity sensors can be integrated in so-called monolithic microwave integrated circuits (MMICs). Radar sensors may be applied, for example, in the automotive sector, where they are used in so-called advanced driver assistance systems (ADAS) such as, for example, "adaptive cruise control" (ACC) or "radar cruise control" systems. Such systems may be used to automatically adjust the speed of an automobile so as to maintain a safe distance from other automobiles travelling ahead. However, RF circuits are also used in many other fields such as RF communication systems.

A radar MMIC (sometimes referred to as single chip radar) may incorporate all core functions of the RF frontend of a radar transceiver (e.g., local oscillator, power amplifiers, low-noise amplifiers (LNA), mixers, etc.), the analog preprocessing of the intermediate frequency (IF) or base band signals (e.g., filters, amplifiers, etc.), and the analog-to-digital conversion in one single package. The RF frontend usually includes multiple reception and transmission channels, particularly in applications in which beam steering techniques, phased antenna arrays, etc. are used. In radar applications, phased antenna arrays may be employed to sense the incidence angle of incoming RF radar signals (also referred to as "Direction of Arrival", DOA).

In addition, the radar MMIC includes an RF phase-locked loop (PLL) to create a radar ramping signal. In some cases, a frequency synthesizer that uses a fractional multi-modulus divider (MMD) that uses two consecutive integer values N and N+1 to obtain a fractional value. The use of the MMD can generate a set of unwanted spurious outputs, so called fractional N spurious or fractional spurs, inside the used frequency range of the ramping signal. In particular, a fractional spur is a parasitic product of a PLL when the MMD dividing coefficient is a fractional value very close to one of its integer values (i.e., a fraction of integer N). Additionally, integer spurs occur at integer (1, 2, 3 . . . 20, 21 . . . ) multiples of the PLL's phase frequency detector's (PFD's) reference (or comparison) frequency Fref. For example, if Fref=100 MHz, there will be integer spurs at 100 MHz, 200 MHz, 300 MHz . . . 2000 MHz, 2100 MHz.

In the case of a current MMD divider coefficient being close to an integer value, the PLL generates a wide set of spurious with high levels. The offset frequency of the main spurious and its harmonics depends on the difference between the current MMD divider coefficient (i.e., MMD value) and the closest integer value of the PLL's PFD's reference frequency Fref, as shown in FIG. 1, which illustrates frequency components of a radar ramping signal and a fractional spur by way of a Discrete Fourier Transform (DFT) under a conventional radar system.

Figure 1:
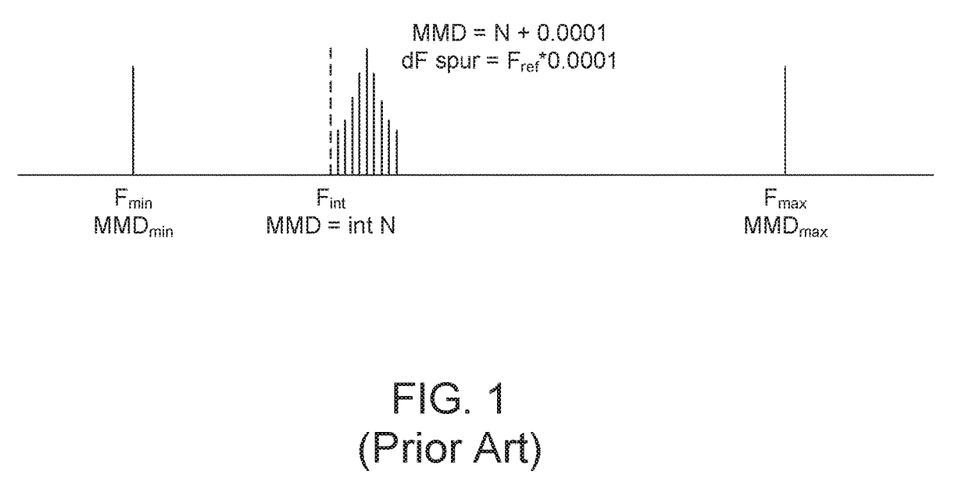
FIG. 1 illustrates frequency components of a radar ramping signal and a fractional spur by way of a Discrete Fourier Transform (DFT) under a conventional radar system.

Here, in FIG. 1, frequency Fmin represents the minimum frequency of the ramping signal and corresponds to the minimum divider coefficient $MMD_{min}$ of the MMD used for the radar application. Similarly, frequency Fmax represents the maximum frequency of the ramping signal and corresponds to the maximum divider coefficient $MMD_{max}$ of the MMD used for the radar application. As such, frequency Fmin and frequency Fmax define the maximum frequency range or the frequency band of the ramping signal, and, thus, the frequency range or the frequency band of the radar application of the radar MMIC.

In addition, frequency Fint represents an integer value of the PLL's PFD's reference frequency Fref at which an integer N spurious occurs. Frequency Fint also corresponds to the MMD divisor factor being equal to an integer value (i.e., MMD=int N). For example, the MMD's integer value may be equal to the MMD's minimum integer value N or the MMD's maximum integer value N+1. In this example, the MMD divisor factor (i.e., the rational factor R) is N+0.0001, which results in a main fractional N spurious inside the radar frequency band and possibly inside the ramping signal at Fint, which masks radar signals at Fref*0.0001 in the case of a strong radar target. In a case when a fixed divider is used between a controlled oscillator and an MMD, the formula shall be: Fref*0.0001*Fix_Div_coeff, where Fix_Div_coeff is the divider coefficient of the fixed divider.

This fractional N spurious inside the frequency range of the ramping signal results in an increase of the noise flow around this radar target which results in masking potential small targets in the near field of the radar MMIC. In other words, the fractional N spurious inside the frequency range of the ramping signal may obscure or even prevent small targets from being detected.

In view of the above, an improved radar PLL device may be desired that ensures any fractional N spurious does not occur inside the frequency range of the ramping signal.

SUMMARY

Embodiments provide a method for and a device for reducing the effect of fractional N spurs on a system.

One or more embodiments provide a signal generator that includes a first phase-locked loop (PLL) configured to receive a first reference signal having a first reference frequency and generate a ramping signal based on the first reference signal, wherein the ramping signal is between a minimum frequency and a maximum frequency of a radar frequency band; a system clock configured to generate a second reference signal having a common system reference frequency; and a second PLL configured to receive the second reference signal from the system clock, generate the first reference signal based on the second reference signal, and provide the first reference signal to the first PLL One or more embodiments provide a method of preventing fractional spurs inside a radar frequency band having a frequency range including a minimum frequency and a maximum frequency. The method includes generating, by a first phase-locked loop (PLL), the ramping signal based on a first reference signal; generating, by a system clock, a second reference signal having a common system reference frequency; generating, by a second PLL, the first reference signal based on the second reference signal; and transmitting, by the second PLL, the first reference signal to the first PLL.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and/or any other processes required to make a sensor output suitable for processing after conditioning.

Thus, a signal processing circuit may include analog circuitry and/or digital circuitry including an analog-to-digital converter (ADC) that converts the analog signal from the one or more sensor elements to a digital signal. The signal processing circuit may include a digital signal processor (DSP) that performs some processing on the digital signal.

Embodiments are discussed below in the context of a radar transmitter or transceiver. It should be noted, however, that the described embodiments may also be applied in applications different from radar such as, for example, RF transceivers of RF communication devices.

Figure 2:
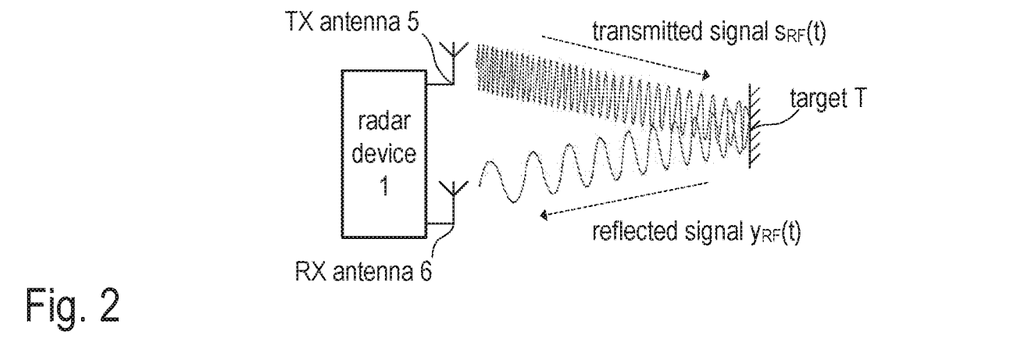
FIG. 2 is a drawing illustrating the operating principle of a frequency-modulated continuous-wave (FMCW) radar system for distance and/or velocity measurement.

FIG. 2 illustrates a frequency-modulated continuous-wave (FMCW) radar system 1. In the present example, separate transmission (TX) and reception (RX) antennas 5 and 6, respectively, are used. However, it is noted that a single antenna can be used so that the transmission antenna and the reception antenna are physically the same (monostatic radar configuration). The transmission antenna continuously radiates an RF signal $S_{RF}(t)$, which is frequency-modulated, for example, by a periodic linear frequency ramp signal (also referred to as frequency sweep or chirp signal). The transmitted signal $S_{RF}(t)$ is back-scattered at a target T, which is located in the radar channel within the measurement range of the radar device. The back-scattered signal $y_{RF}(t)$ is received by the reception antenna 6. In the depicted example, the back-scattered signal is denoted as $y_{RF}(t)$.

Figure 3:
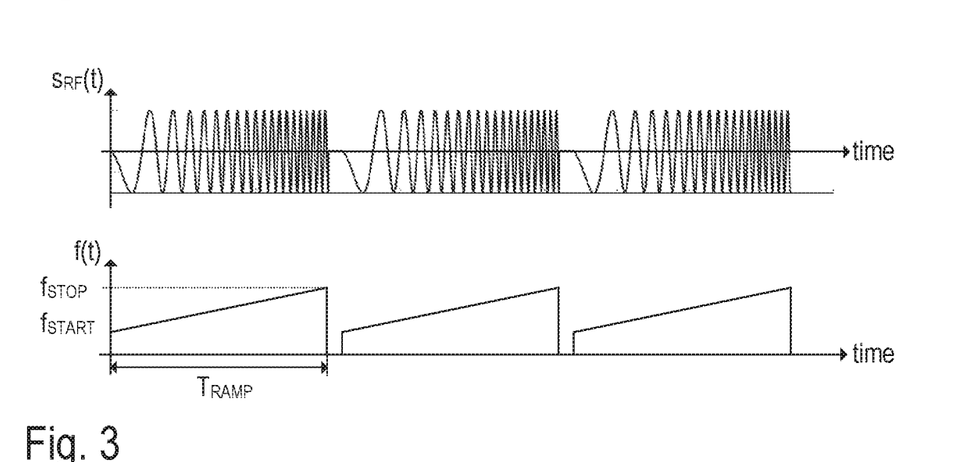
FIG. 3 includes two timing diagrams illustrating the frequency modulation of the radio frequency (RF) signal used in FMCW radar systems.

FIG. 3 illustrates the mentioned frequency-modulation of the signal $S_{RF}(t)$ according to one or more embodiments. As shown in the top diagram of FIG. 3, the signal $S_{RF}(t)$ may be composed of a series of "ramps", i.e., a sinusoidal waveform with increasing (up-chirp) or decreasing (down-chirp), separated by a short pause. Several ramps with short pauses in between make up a "chirp". Radar sends sequences of frames or data units during a single "ramp" which represents one radar measurement. In addition, there is a pause between chirps. In the present example, a single chirp composed of three ramps is shown. A pause follows the third ramp, after which another chirp is started. Thus, each ramp includes a plurality of frames, and each chirp includes a plurality of ramps and a plurality of short pauses between ramps.

The instantaneous frequency f(t) of a ramp increases linearly from a start frequency $f_{START}$ (i.e., frequency Fmin) to a stop frequency $f_{STOP}$ (i.e., frequency Fmax) within a defined time span $T_{RAMP}$ (see bottom diagram of FIG. 3). Such a ramp is also referred to as a linear frequency ramp. As such, frequency $f_{START}$ and frequency $f_{STOP}$ define the frequency range of a single ramping signal. The ramping signal may be further referred to as a FMCW radar signal or a periodic ramping signal.

It will be appreciated that the start frequency $f_{START}$ and stop frequency $f_{STOP}$ of the ramps may be within a frequency band with minimum frequency Fmin and maximum frequency Fmax. As such, frequency Fmin and frequency Fmax define the predetermined frequency range or the frequency band usable for the ramping signals, and, thus, the frequency range or the frequency band of the radar application of the radar MMIC. In some embodiments, the frequency range defined by a single ramp having start and stop frequencies $f_{START}$ and $f_{STOP}$ may be significantly smaller than the usable frequency band. However, all ramps that are generated during operation lie between the frequencies Fmin and Fmax of the radar band used for generating the ramping signals.

Three identical linear frequency ramps are illustrated in FIG. 3. It is noted, however, that the parameters $f_{START}$, $f_{STOP}$, $T_{RAMP}$ as well as the pause between the individual frequency ramps may vary dependent on the actual implementation and use of the radar device 1. In practice, the frequency variation may be, for example, linear (linear ramp, frequency ramp), exponential (exponential ramp), or hyperbolic (hyperbolic ramp). In some embodiments, the frequency may decrease instead of increase during time $T_{RAMP}$. Furthermore, in other embodiments the center frequency of each ramp (and therefore fstart and fstop) may vary (e.g. from ramp to ramp or after detecting an interference) to allow using the full or a part of the frequency band. In one example, the frequency band has a Fmin of 76 GHz and Fmax of 81 GHz.

Figure 4:
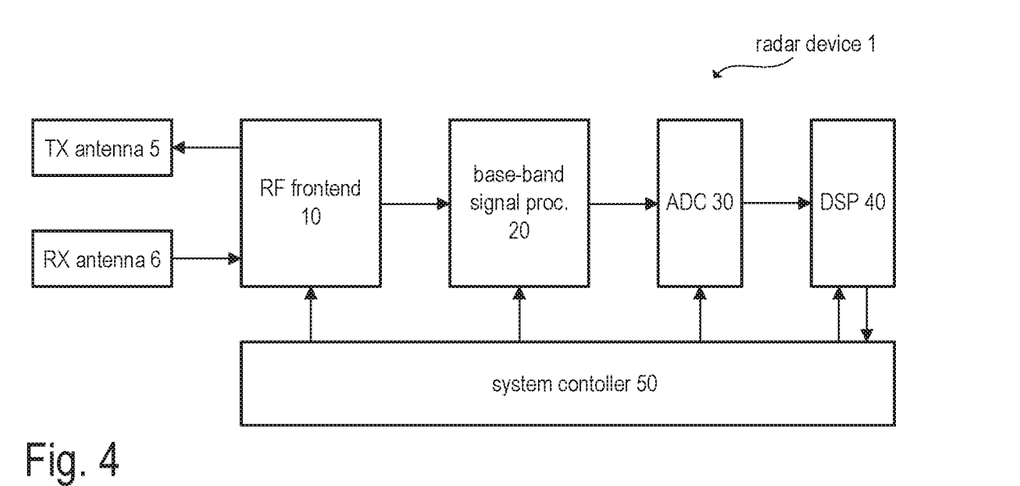
FIG. 4 is a block diagram illustrating the basic structure of an FMCW radar device.

FIG. 4 is a block diagram that illustrates an exemplary structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MMIC).

The RF frontend 10 may include all the circuit components needed for RF signal processing. Such circuit components may (but need not necessarily) include, for example, a local oscillator (LO), RF power amplifiers, low noise amplifiers (LNAs), directional couplers such as rat-race-couplers and circulators, and mixers for the down-conversion of RF signals (e.g., the received signal $y_{RF}(t)$, see FIG. 2) into the base-band or an intermediate frequency (IF) band.

It is noted that antenna-arrays may be used instead of single antennas. The depicted example shows a bistatic (or pseudo-monostatic) radar system which has separate RX and TX antennas. In the case of a monostatic radar system, a single antenna or a single antenna array may be used to both receive and transmit electromagnetic (radar) signals. In this case, a directional coupler (e.g., a circulator) may be used to separate RF signals to be transmitted to the radar channel from RF signals received from the radar channel. In practice, radar systems often include several transmission (TX) and reception (RX) channels, which among others allows the measurement of the direction (direction of arrival (DoA)), from which the radar echoes are received.

In the case of a frequency-modulated continuous-wave (FMCW) radar system, the transmitted RF signals radiated by the TX antenna 5 are in the range between approximately 20 GHz and 100 GHz (e.g. in the frequency band 21 to 26 GHZ or in the frequency band 76 to 81 GHz). As mentioned, the RF signal $y_{RF}(t)$ received by the RX antenna 6 includes the radar echoes, i.e., the signal back-scattered at the so-called radar targets.

The received RF signals $y_{RF}(t)$ are down-converted into the base band (or IF band) and further processed in the base band using analog signal processing (see FIG. 4, base-band signal processing chain 20), which basically includes filtering and amplification of the base-band signal.

The base-band signal is finally digitized using one or more analog-to-digital converters (ADC) 30 and further processed in the digital domain (see FIG. 4, digital signal processing chain implemented, e.g., in digital signal processor, DSP, 40). The RF frontend 10 and the analog base-band signal processing chain 20 (and optionally the ADC 30) may be integrated in a single MMIC. However, in some applications, some components may also be distributed among two or more integrated circuits.

The overall system is controlled by a system controller 50, which may be at least partly implemented using a processor, such as a microcontroller executing appropriate firmware.

Figure 5:
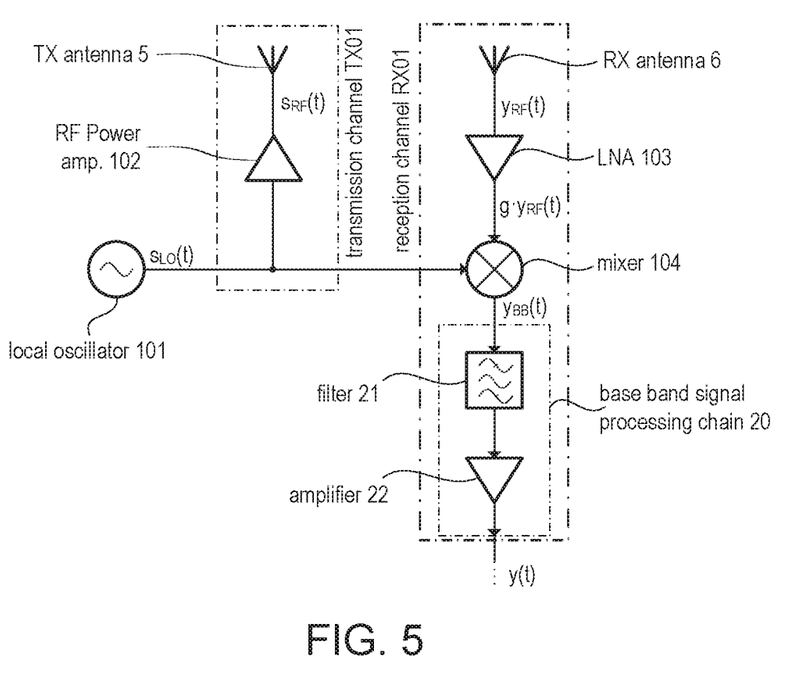
FIG. 5 is a circuit diagram illustrating one example of an analog RF frontend, which may be included in the FMCW radar device of FIG. 3.

FIG. 5 illustrates one exemplary implementation of the RF frontend 10, which may be included in the radar sensor shown in FIG. 4. It is noted that FIG. 5 is a simplified circuit diagram illustrating the basic structure of the RF frontend. Actual implementations, which may heavily depend on the application, are of course more complex and include several RX and/or TX channels. The RF frontend 10 includes a local oscillator 101 (LO) that generates a RF signal $S_{LO}(t)$, which may be frequency-modulated as explained above with reference to FIG. 3. The signal $S_{LO}(t)$ is also referred to as LO signal. In radar applications, the LO signal is usually in the SHF (Super High Frequency) or the EHF (Extremely High Frequency) band, e.g., between 76 GHz and 81 GHz in automotive applications. The LO signal may also be generated at a lower frequency and then up-converted using frequency multiplication units.

The LO signal $S_{LO}(t)$ is processed in the transmission signal path as well as in the reception signal path. The transmission signal $S_{RF}(t)$ (outgoing radar signal), which is radiated by the TX antenna 5, is generated by amplifying the LO signal $S_{LO}(t)$, e.g., using an RF power amplifier 102. The output of the amplifier 102 is coupled to the TX antenna 5. The received signal $y_{RF}(t)$ (incoming radar signal), which is provided by the RX antenna 6, is directed to a mixer 104. In the present example, the received signal $y_{RF}(t)$ (i.e., the antenna signal) is pre-amplified by RF amplifier 103 (gain g), so that the mixer receives the amplified signal $g \cdot y_{RF}(t)$ at its RF input port.

The mixer 104 further receives the LO signal $S_{LO}(t)$ at its reference input port and is configured to down-convert the amplified signal $g \cdot y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 4), which basically includes one or more filters (e.g., a band-pass 21) to remove undesired side bands and image frequencies as well as one or more amplifiers such as amplifier 22). The analog output signal, which may be supplied to an analog-to-digital converter (cf. FIG. 4), is denoted as y(t). Various techniques for the digital post-processing of the digitized output signals (digital radar signal) are as such known (e.g., Range Doppler Analysis) and thus not further explained herein.

In the present example, the mixer 104 down-converts the RF signal $g y_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). In view of the example of FIG. 5, it is clear that the quality of the radar measurement will heavily depend on the quality of the LO signal $S_{LO}(t)$. Low phase noise, as well as steep and highly linear frequency ramps are desired properties of the LO signal $S_{LO}(t)$.

Figure 6:
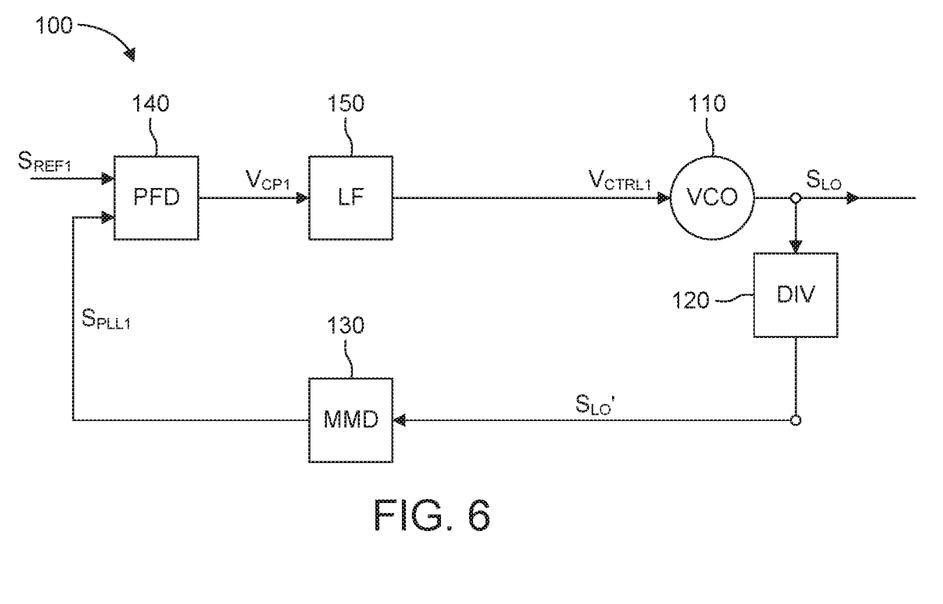
FIG. 6 shows a block diagram illustrating a main phase-locked loop (PLL) for generating a frequency-modulated RF signal (e.g., a ramping signal) according to one or more embodiments.

FIG. 6 shows a block diagram illustrating a main phase-locked loop (PLL) 100 for generating a frequency-modulated RF signal (e.g., a ramping signal) according to one or more embodiments. In particular, a schematic circuit diagram is shown that depicts, by way of example, the basic structure of an oscillator or local oscillator that comprises a main phase-locked loop (PLL) having a controlled oscillator 110, which may be a voltage-controlled oscillator (VCO) or a digitally-controlled oscillator (DCO). In this example, the controlled oscillator is depicted as a VCO and may be referred to as VCO 110.

In the present example, the VCO 110 generates an RF oscillator signal $S_{LO}(t)$ that may lie, for example, in the EHF band (30 GHz to 300 GHz) and that may be used for a radar signal. In particular, the VCO 110 is configured to generate a signal whose frequency $f_{LO}$ varies from $f_{START}$ to $f_{STOP}$ and lies within the frequency band from Fmin to Fmax as described herein. The main PLL 100 may be composed of digital components, analog components, or a combination thereof.

A frequency $f_{LO}$ of the RF oscillator signal $S_{LO}(t)$ depends on an input control voltage $V_{CTRL1}$ of the VCO 110. Since the frequency $f_{LO}$ may be too high for direct further processing, a fixed frequency divider 120 having a constant division ratio 1/M may be connected downstream of the VCO 110. However, altogether, he fixed frequency divider 120 is optional depending on implementation.

The factor (i.e., the divisor) M is a whole number as a power of 2 (e.g., 1, 2, 4, 8, 16, 32, etc.). For example, using an example of 1/M=1/32, an oscillator frequency $f_{LO}$ of 80 GHz would be reduced to 2.5 GHz. The factor M is constant during operation, that is to say M does not change during operation. M may nevertheless be set to a desired value depending on the configuration of the RF front-end 10. When the factor M is greater than one, the fixed frequency divider 120 generates a reduced-frequency oscillator signal based on the ramping signal. On the other hand, when the factor is equal to one, the ramping signal is essentially passed through the fixed frequency divider 120 unchanged. The frequency at the output of the frequency divider 120 is referred to as $f_{LO}'$ ($f_{LO}'=f_{LO}/M$), and the reduced-frequency oscillator signal or the passed-through ramping signal is referred to as $S_{LO}'(t)$.

A multi-modulus divider (MMD) 130 is connected downstream of the frequency divider 120. The MMD 130 is designed to reduce the frequency $f_{LO}'$ of the signal $S_{LO}'(t)$ by a variable factor N. The output signal of the MMD 130 is referred to as $S_{PLL1}(t)$, and its frequency is referred to as $f_{PLL}$ ($f_{LO}'/N=f_{PLL}$). By continuously varying the division ratio 1/N of the MMD 600 (for example by way of a delta-sigma modulator), a rational factor R is effectively able to be brought about. In this case, a desired rational factor R is modulated. An updated whole-number factor value N (e.g., N or N+1) for the MMD 130 is generated at the output of the delta-sigma modulator in each clock cycle. On average, a rational factor R is obtained. Such frequency divider circuits (MMD and modulator) are also referred to as fractional dividers.

In particular, the whole-number factor value N for the MMD 130 may be dynamically varied between two consecutive integers N and N+1 to generate a fractional value. The whole-number factor value N for the MMD 130 at any given time is $f_{LO}/(M*Fref1)$, where Fref1 is the frequency of the reference signal Sref1(t), and is also referred to as reference frequency Fref1. The MMD 130 varies the divide number between N and N+1 dynamically in such a way as to provide an averaged divide ratio that is a fractional number between N and N+1. This function enables the generation of an average division that is a fractional number.

The MMD 130 is configured to generate the minimum frequency Fmin of the implemented radar frequency band based on a first fractional value and generate the maximum frequency Fmax of the implemented frequency band based on a second fractional value, where the first fractional value and the second fractional value are between the two consecutive integers N and N+1. Thus, a first margin is provided as a buffer between the lower integer N and the first fractional value. Similarly, a second margin is provided as a buffer between the second fractional value and the higher integer N+1. As will be described later, this allows generating ramp signals within the frequency band having non-measurable fractional N spurs.

The first and second margins may correspond to a frequency of at least 100 MHz in the frequency domain. In other words, an MMD frequency corresponding to the lower integer N is at least 100 MHz less than an MMD frequency corresponding to the first fractional value (i.e., the minimum frequency Fmin). Similarly, an MMD frequency corresponding to the higher integer N+1 is at least 100 MHz greater than an MMD frequency corresponding to the second fractional value (i.e., the maximum frequency Fmax).

For example, a 6-7 MMD varies its integer divisor between 6 and 7 to arrive at a rational factor between those two integers. Similarly, a 9-10 MMD varies its integer divisor between 9 and 10 to arrive at a rational factor between those two integers. It will be appreciated that MMD 130 may be configured with any set of integers N and N+1, according to implementation, and is not limited to any of the examples provided herein.

Thus, the concept of fractional division ratio is achieved by generating a divider that is a fractional number rather than an integer. The divider is changed between the values N and N+1 in such a way that the "average" division becomes a fraction N+K/F. If out of F cycles, a division by N+1 is made K number of times and by N, F−K number of times, then the average division is N+K/F. The principle of fractionality is therefore a result of averaging, as there is no device that can directly divide by a fractional number.

The output signal $S_{PLL1}(t)$ of the multi-modulus divider 130 and a reference signal $S_{REF1}(t)$, having a reference frequency Fref1 are fed to a phase detector or a phase frequency detector (PFD) 140 that is designed to compare the phases (or phases and frequencies) of the signals $S_{PLL1}(t)$ and $S_{REF1}(t)$. A PFD generates a voltage or a code (i.e., an error signal), which represents the phase and/or frequency difference between two signals. In a PLL, the two inputs of the PFD are the reference input and the feedback from the VCO. The PFD output voltage is used to control the VCO such that the phase and frequency difference between the two inputs is held constant, making it a negative feedback system. Thus, the output signal $V_{CP1}$ of the phase frequency detector 140 depends on the detected phase and/or frequency difference.

The output signal $V_{CP1}$ of the PFD 140 is fed to what is known as the loop filter (LF) 150. This loop filter 150 for instance may be a low-pass filter (LPF) that determines the bandwidth of the PLL and provides the control voltage $V_{CTRL1}$ for the VCO 110 at its output, as a result of which the control loop is closed. The VCO 110 adjusts its output (e.g., its frequency) based on the control voltage $V_{CTRL1}$, which depends on the error signal generated by the PFD 140. For example, if the frequency from the VCO 110 falls behind that of the frequency of the reference signal, the PFD 140 changes the control voltage of the VCO 110 so that it speeds up. Likewise, if the frequency creeps ahead of the frequency of the reference signal, the PFD 140 changes the control voltage to slow down the VCO 110.

Thus, the VCO 110 generates a periodic signal $S_{LO}$, and the PFD 140 compares the phase of that signal, via $S_{PLL1}$, with the phase of the input periodic signal (i.e., reference signal $S_{REF1}$), adjusting the VCO 110 to keep the phases matched.

In steady state, the phases of the signals $S_{PLL1}$ and $S_{REF1}$ are "locked" (or a locked state is achieved) and the phases of the signals $S_{PLL1}$ and $S_{LO}$ are synchronized with the phase of the reference signal $S_{REF1}$. Keeping the input and output phase in lock step also implies keeping the input and output frequencies the same. The reference signal $S_{REF1}$ may be generated for example by way of a quartz oscillator (not illustrated) or may be generated based on a quartz oscillator signal (for example by way of frequency multiplication or frequency division).

In order to ensure that no fractional N spurious occur inside the frequency range of the ramping signal (i.e., between frequencies Fmin and Fmax), the reference signal $S_{REF1}$ having reference frequency Fref1 is supplied from separate source. In particular, an additional signal generator (i.e., an additional PLL circuit) is provided that generates the reference signal $S_{REF1}$ that is used by the main PLL 100. The additional PLL for creating the reference frequency Fref1 may be realized inside a radar chip as a pure digital implementation using, for example, a narrow band digital ring oscillator with one frequency. In addition, the additional PLL should have internal divider values as low as possible and a PFD comparation frequency as high as possible to reduce its output noise.

Furthermore, the signal generator is configured such that there are no fractional N spurious in a range from (Fmin−100 MHz) to (Fmax+100 MHz). In other words, any existing fractional spurs occur either at least 100 MHz below the minimum frequency Fmin or at least 100 MHz above than the maximum frequency Fmax, with no fractional spur existing between the 100 MHz boundaries.

Figure 7A:
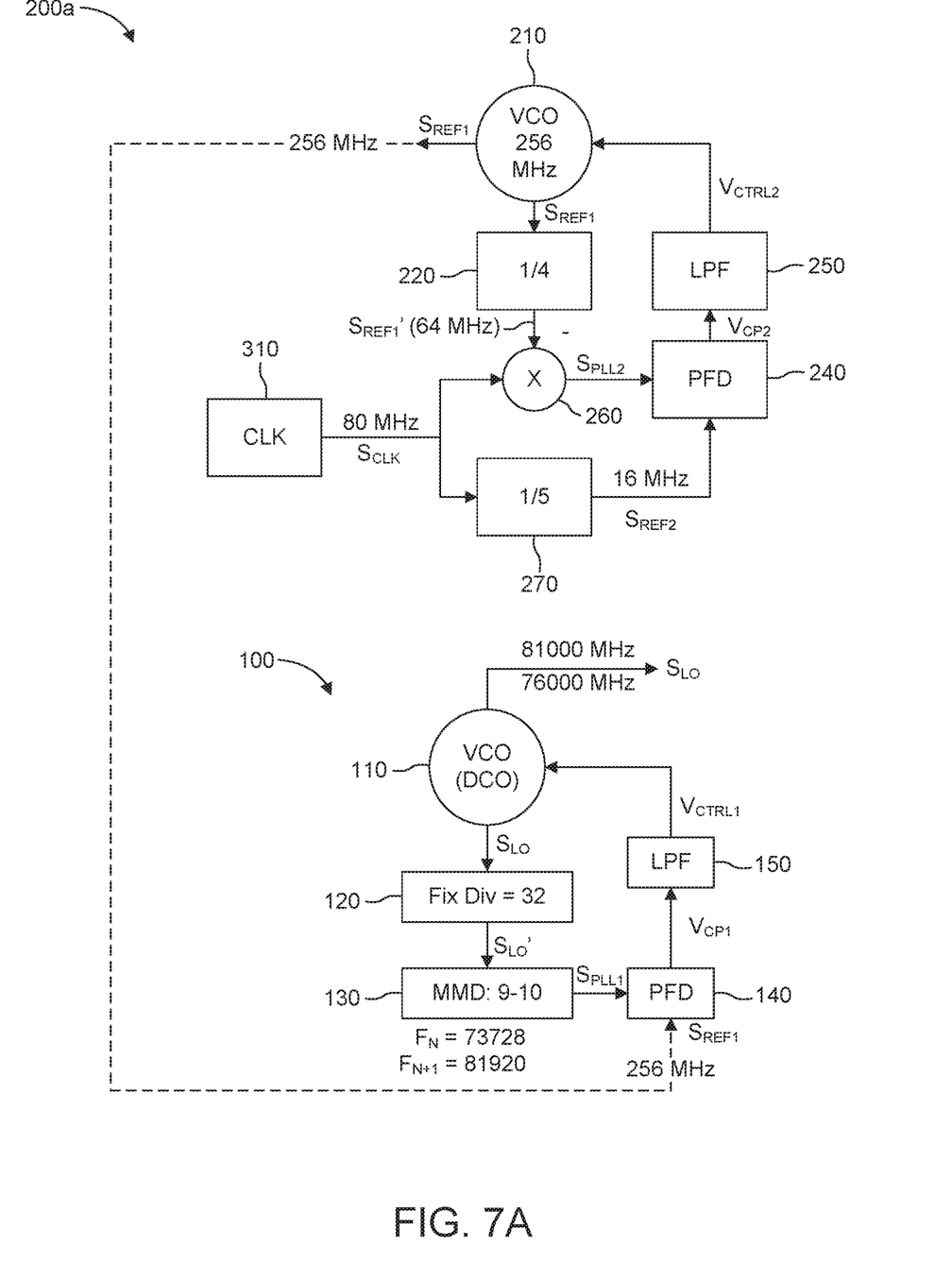
FIG. 7A shows a block diagram illustrating a signal generator according to one or more embodiments.

FIG. 7A shows a block diagram illustrating a signal generator according to one or more embodiments. In particular, the signal generator includes the main PLL 100 described in FIG. 6 and an additional PLL 200a. The additional PLL 200a is configured to generate the first reference signal $S_{REF1}$ to be provided to the main PLL 100. Moreover, the additional PLL 200a is a purely digital circuit that provides the first reference signal $S_{REF1}$ to the PFD 140 of the main PLL 100. While certain parameters may be discussed having certain set values, it will be appreciated that these values are merely used to facilitate the description and that these parameters are configurable.

The VCO 110 is configured to generate ramping signals $S_{LO}$ having a frequency $F_{LO}$ that may be between 76 GHz and 81 GHz. The division ratio of the fixed frequency divider 120 is set to 1/32 and the integer values N and N+1 of the MMD 130 are set to 9 and 10, respectively. In addition, the reference frequency Fref1 of the first reference signal $S_{REF1}$ is set to 256 MHz by the additional PLL 200a.

As a result, integer N frequencies for the integer spurs nearest to the frequency range of the VCO 110 are at $F_N$ 73728 MHz (i.e., Fref1×M×N), which is 2272 MHz below the radar frequency range, and at $F_{N+1}$ 81920 MHz (i.e., Fref1×M×(N+1)), which is 920 MHz above the radar frequency range. Thus, an integer free frequency range, including the full radar frequency range, is created. As a result, there is no mechanism to produce fractional spurs within the radar frequency band or in the ramping signal itself when the MMD fractional value approaches an integer value N or N+1, such as when the MMD fraction value is N+0.000X, where X is an integer.

As used herein, "integer free frequency range" or "expanded integer free frequency range" refers to a frequency range that is substantially free of integer and fractional spurs, where "substantially" means that any integer or fractional spur that may be present within the frequency range has a power level that is less than a thermal noise level (−174 dBm/Hz) at room temperature (25° C.). A signal that has a power level that is less than the thermal noise level is not detectable because it is below the noise floor. Thus, an "integer free frequency range" or an "expanded integer free frequency range" is a frequency range in which no detectable fractional spurs are present.

The schematic circuit diagram shown in FIG. 7A further depicts the additional PLL 200a as an oscillator that comprises an additional PLL that is used as a reference PLL. It is because of this additional PLL, which is configured to generate the reference signal $S_{REF1}$ from a common system reference frequency (i.e., generated by a common system clock 310), that the integer free frequency range is possible. Here, "common" is intended to mean that the signal is shared with or is common to other system components.

The additional PLL 200a (i.e., the addition PLL) includes a controlled oscillator 210, which may be a VCO or a DCO. In this and the following examples, the controlled oscillator is depicted as a VCO and may be referred to as VCO 210.

The controlled oscillator 210 is configured to generate a reference signal $S_{REF1}$ at a fixed frequency of 256 MHz as the reference frequency Fref1, which is output to PFD 140. The VCO 210 also provides the reference signal $S_{REF1}$ to a fixed frequency divider 220 having a constant division ratio ¼ to generate a frequency-reduced reference signal $S_{REF1}'$ having a reduced frequency of 64 MHz.

The factor (i.e., the divisor) M of the fixed frequency divider 220 may be a whole number as a power of 2 (e.g., 1, 2, 4, 8, 16, 32, etc.). When the factor M is greater than one, the fixed frequency divider 220 generates a reduced-frequency oscillator signal based on the reference signal $S_{REF1}$. On the other hand, when the factor is equal to one, the reference signal $S_{REF1}$ is essentially passed through the fixed frequency divider 220 unchanged.

A common system clock 310 generates a clock signal $S_CLK$ that has a common system reference frequency $F_{CLK}$ of 80 MHz. A mixer 260, connected downstream from the fixed frequency divider 220, receives the clock signal $S_CLK$ and the frequency-reduced reference signal $S_{REF1}'$ as inputs and produces a PLL signal $S_{PLL2}$ by taking the difference of the frequency-reduced reference signal $S_{REF1}'$ from the clock signal $S_CLK$. As a result, the PLL signal $S_{PLL2}$, being a down-mixed signal, has a frequency of 16 MHz, being the difference between the system reference frequency $F_{CLK}$ of 80 MHz and frequency-reduced reference signal $S_{REF1}'$ having a reduced frequency of 64 MHz, notwithstanding any errors from VCO 210.

In addition, another fixed frequency divider 270 is provided to generate a reference signal $S_{REF2}$ from the clock signal $S_{CLK}$. In this case, the fixed frequency divider 270 has a constant division ratio of 1/5 to generate reference signal $S_{REF2}$, having a frequency of 16 MHz, as another frequency-reduced reference signal.

When the factor M is greater than one, the fixed frequency divider 270 generates a reduced-frequency oscillator signal based on the clock signal $S_{CLK}$. On the other hand, when the factor is equal to one, the clock signal $S_{CLK}$ is essentially passed through the fixed frequency divider 220 unchanged.

As a result, reference signal $S_{REF2}$ and PLL signal $S_{PLL2}$ are generated from the same clock signal $S_{CLK}$ but in different manners, with one being constant by the fixed frequency divider 270 and the other being dependent on the output of the VCO 210. As such, reference signal $S_{REF2}$ and PLL signal $S_{PLL2}$ are intended to be in lock step with each other and are used as the inputs to the PFD 240 for comparing.

While two fixed frequency dividers 220 and 270 are provided in the present embodiment, only one may be required. Thus, other embodiments may include fixed frequency divider 220 with fixed frequency divider 270 removed. In this case, the clock signal $S_{CLK}$ is provided to the PFD 240 as the reference signal $S_{REF2}$. Alternatively, other embodiments may include fixed frequency divider 270 with fixed frequency divider 220 removed. In this case, reference signal $S_{REF1}$ is provided to the mixer 260. These alternative configurations apply to all embodiments described herein in which the two fixed frequency dividers 220 and 270 are shown.

The PFD 240 is designed to compare the phases (or phases and frequencies) of the signals $S_{PLL2}$ and $S_{REF2}$ and generate a voltage (i.e., an error signal), which represents the phase and/or frequency difference between two signals. The PFD output voltage $V_{CP2}$ is used to control the VCO 210 such that the phase and frequency difference between signals $S_{PLL2}$ and $S_{REF2}$ is held constant, making it a negative feedback system. Thus, the output signal of the PFD 240 depends on the detected phase and/or frequency difference.

The output signal $V_{CP2}$ of the PFD 240 is fed to a loop filter 250 which provides the control voltage $V_{CTRL2}$ for the VCO 210 at its output, as a result of which the control loop is closed. The VCO 210 adjusts its output (e.g., its frequency) based on the control voltage $V_{CTRL2}$, which depends on the error signal generated by the PFD 240, in order to maintain a constant frequency of 256 MHz for reference signal $S_{REF1}$.

Figure 7B:
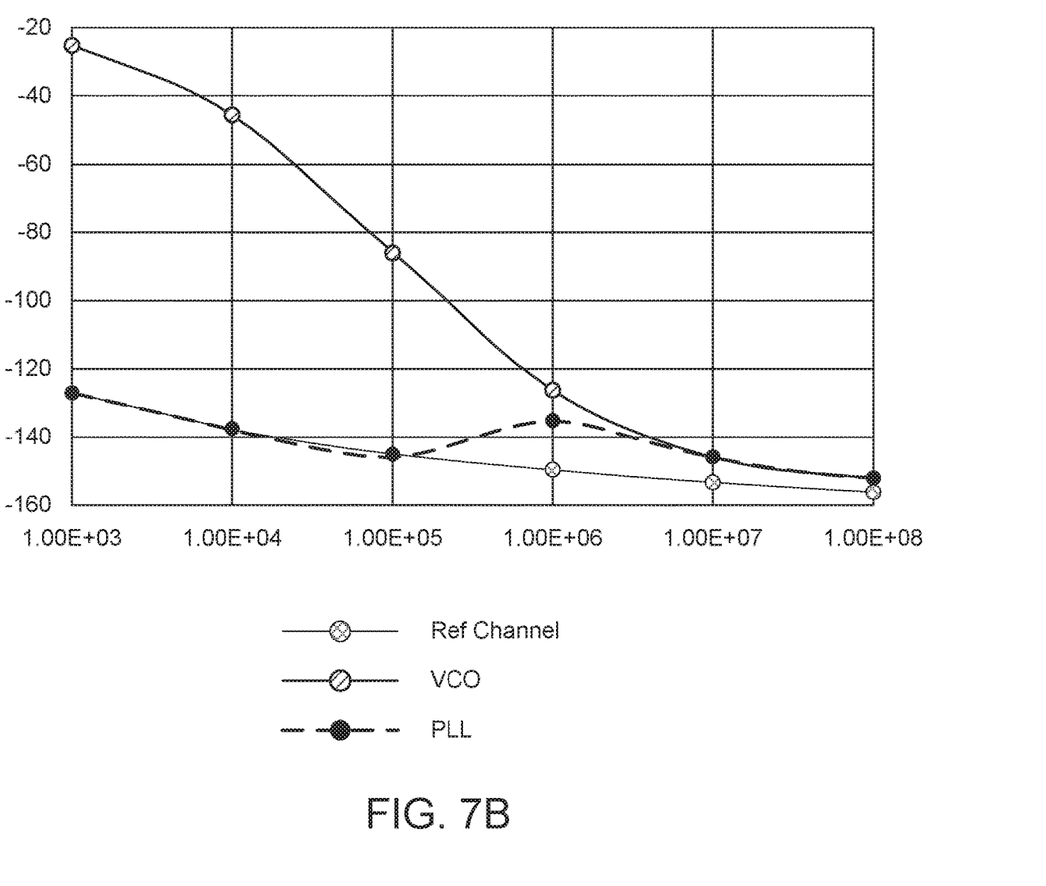
FIG. 7B is a graph illustrating noise simulations for an additional PLL.

FIG. 7B is a graph illustrating noise simulations for the additional PLL200a (i.e., the additional PLL). The additional PLL uses a low divider value (i.e., 5) for the fixed frequency divider 270 in the reference signal path which allows a high PFD comparison frequency of 16 MHz to create a noise level as low as possible as shown FIG. 7B. The reference signal path (i.e., reference channel) of the additional PLL200a is defined by the path from the common system clock 310 and the fixed frequency divider 270, which are used to generate the reference signal $S_{REF2}$, and the PFD 240, which receives the reference signal $S_{REF2}$.

Figure 8A:
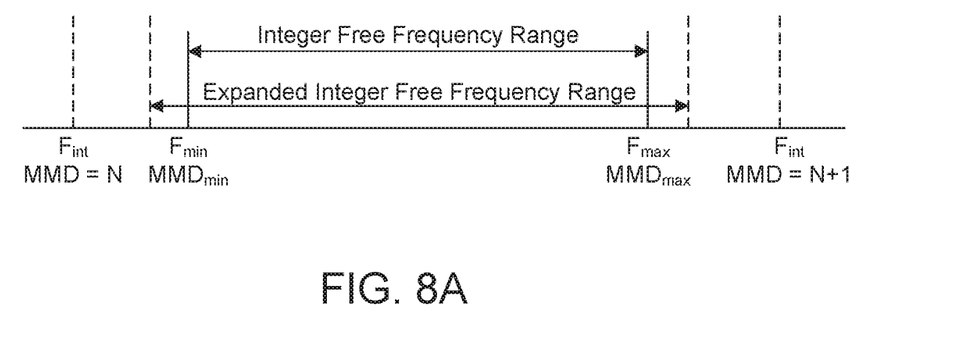
FIG. 8A is a diagram showing frequency components of a signal generator according to one or more embodiments.

FIG. 8A is a diagram showing frequency components of a signal generator according to one or more embodiments. In particular, FIG. 8A shows that an integer free frequency range is created by a main PLL used in combination with an additional PLL that generates the reference frequency of the main PLL. The integer free frequency range completely encompasses the frequency range of the radar application (i.e., the frequency range of the applied ramping signal) such that the integer free frequency range extends at least from the minimum frequency Fmin to the maximum frequency Fmax applied by the VCO 110. More preferably, the integer free frequency range is expanded by at least +/−100 MHz in both directions such that an expanded integer free frequency range extends from at least 100 MHz below the minimum frequency Fmin and at least 100 MHz above than the maximum frequency Fmax.

Frequency Fint represents an integer value of the PLL's PFD's reference frequency Fref1 at which an integer N spurious occurs. As explained above, fractional spurs appear close to frequency Fint. Accordingly, there are no integer values of the MMD 130 (e.g., Fint=$F_N$=Fref1×M×N or Fint=$F_{N+1}$=Fref1×M×(N+1)), and thus no thus no integer spurs, that occur within the integer free frequency range, or more preferably, within the expanded integer free frequency range. As a result, there are no integer values of the MMD 130, and thus no integer or fractional spurs, that occur within the frequency range of the VCO 110 used for generating the ramping signal.

Figure 8B:
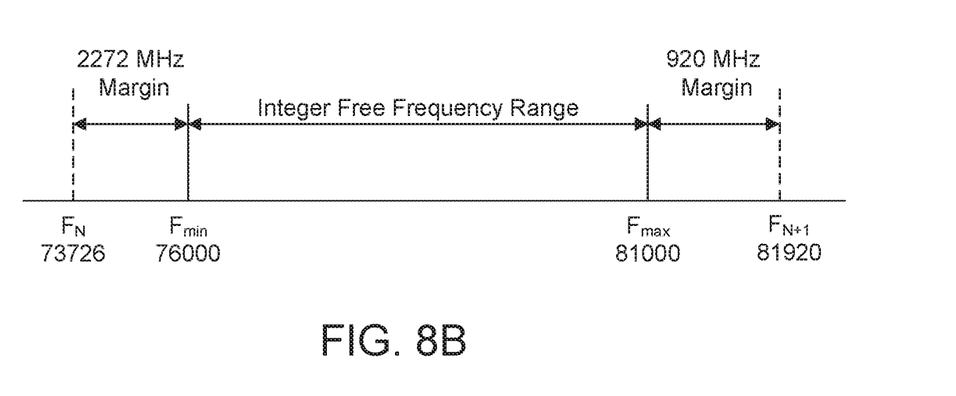
FIG. 8B is a diagram showing frequency components of the signal generator illustrated in FIG. 7A.

FIG. 8B is a diagram showing frequency components of the signal generator illustrated in FIG. 7A. As stated above in reference to FIG. 7A, the VCO 110 is configured to generate ramping signals $S_{LO}$ having a varying frequency $F_{LO}$ that lies between 76 GHz and 81 GHz. The division ratio M of the fixed frequency divider 120 is set to 1/32 and the integer values N and N+1 of the MMD 130 are set to 9 and 10, respectively. In addition, the reference frequency Fref1 of the first reference signal $S_{REF1}$ is set to 256 MHz by the additional PLL200a. As a result, integer N frequencies for the integer spurs nearest to the frequency range of the VCO 110 are at $F_N$ 73728 MHz (i.e., Fref1×M×N), which is 2272 MHz below the radar frequency range, and at $F_{N+1}$ 81920 MHz (i.e., Fref1×M×(N+1)), which is 920 MHz above the radar frequency range. Thus, an integer free frequency range, including the full radar frequency range, is created with sufficient margins from the applied VCO frequency range to ensure that the radar frequency band is substantially free from fractional spurs (i.e., no detectable fractional spurs are present in the radar frequency band). As a result, the noise flow around a strong target does not prevent potential small targets in the radar MMIC's near field from being detected.

Figure 9:
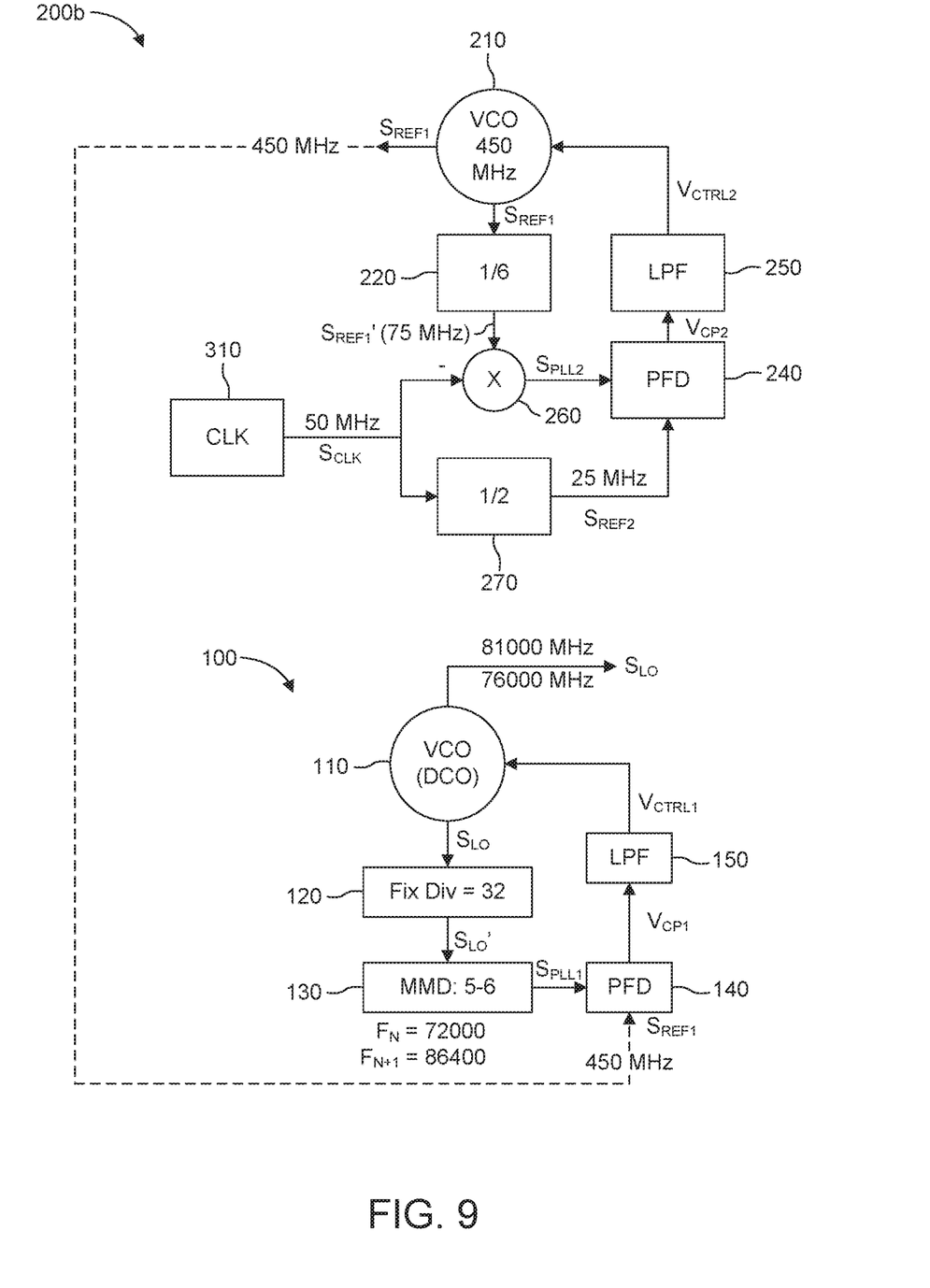
FIG. 9 shows a block diagram illustrating a signal generator according to one or more embodiments.

FIG. 9 shows a block diagram illustrating a signal generator according to one or more embodiments. In particular, the signal generator is similar to that illustrated in FIG. 7A, and only differs in its parameters used for generating a constant frequency of 450 MHz for reference signal $S_{REF1}$. The signal generator includes the main PLL100 described in FIG. 6 and an additional PLL 200b. The additional PLL200b is configured in a similar manner as the additional PLL 200a, but with different parameters as shown and with the exception that the mixer 260 of the additional PLL200b, connected downstream from the fixed frequency divider 220, receives the clock signal $S_{CLK}$ and the frequency-reduced reference signal $S_{REF1}'$ as inputs and produces a PLL signal $S_{PLL2}$ by taking the difference of the clock signal $S_{CLK}$ from the frequency-reduced reference signal $S_{REF1}'$.

Like the additional PLL200a, the additional PLL200b is configured to generate the first reference signal $S_{REF1}$ to be provided to the main PLL100. Moreover, the additional PLL200b is a purely digital circuit.

The VCO 110 is configured to generate a ramping signal $S_{LO}$ having a frequency $F_{LO}$ that varies between 76 GHz and 81 GHz. The division ratio of the fixed frequency divider 120 is set to 1/32 and the integer values N and N+1 of the MMD 130 are set to 5 and 6, respectively. In addition, the reference frequency Fref1 of the first reference signal $S_{REF1}$ is set to 450 MHz by the additional PLL 200b. As a result, integer N frequencies for the integer spurs nearest to the frequency range of the VCO 110 are at $F_N$ 72000 MHz (i.e., Fref1×M×N), which is 4000 MHz below the radar frequency range, and at $F_{N+1}$ 86400 MHz (i.e., Fref1×M×(N+1)), which is 5400 MHz above the radar frequency range. Thus, an integer free frequency range, including the full radar frequency range, is created.

The additional PLL uses a low divider value (i.e., 2) for the fixed frequency divider 270 in the reference signal path which allows a high PFD comparison frequency of 25 MHz to create a noise level as low as possible.

Figure 10:
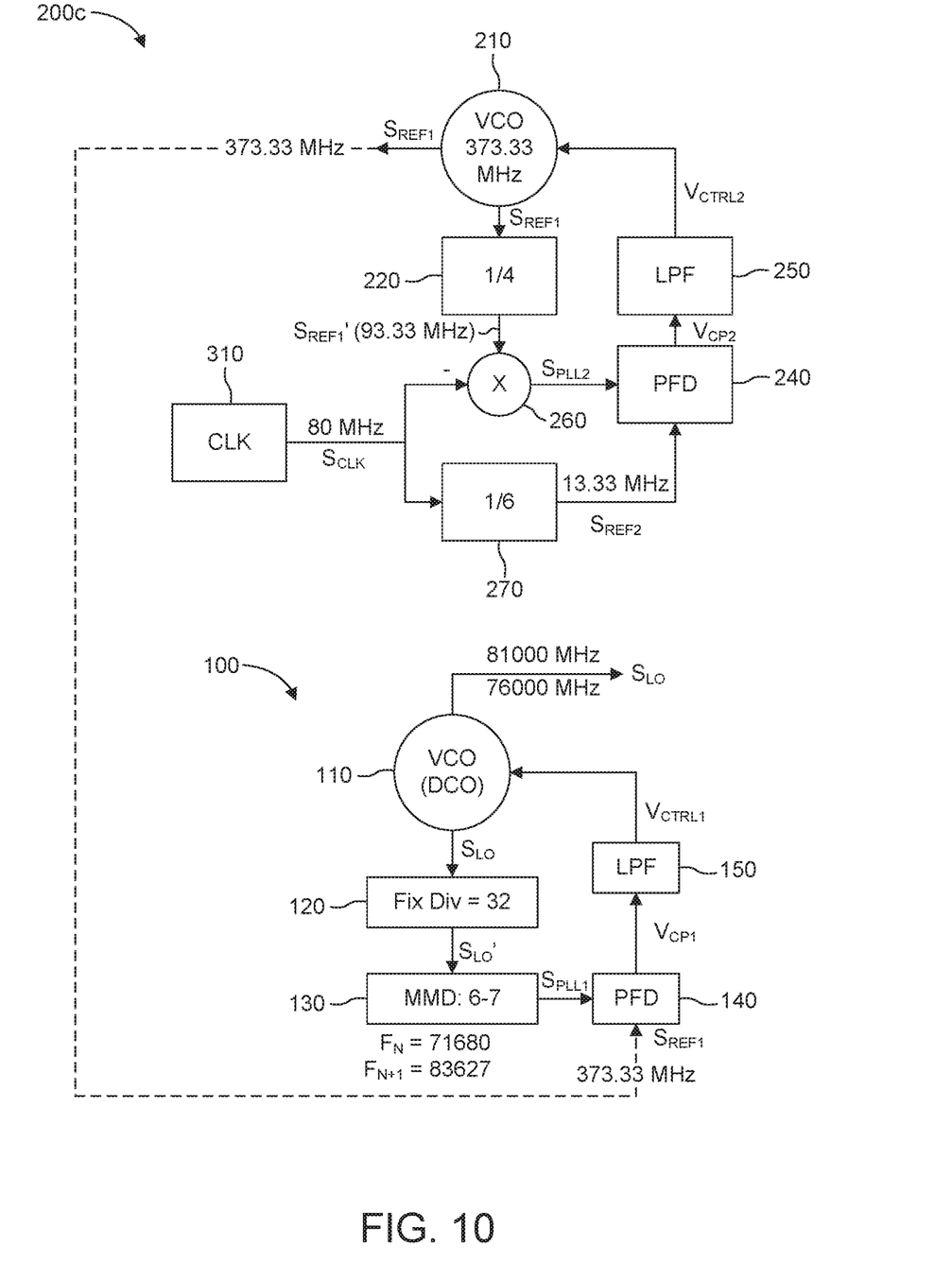
FIG. 10 shows a block diagram illustrating a signal generator according to one or more embodiments.

FIG. 10 shows a block diagram illustrating a signal generator according to one or more embodiments. In particular, the signal generator is similar to that illustrated in FIG. 9, and only differs in its parameters used for generating a constant frequency of 373.33 MHz for reference signal $S_{REF1}$. The signal generator includes the main PLL100 described in FIG. 6 and an additional PLL200c. The additional PLL200c is configured in a similar manner as the additional PLL 200b, but with different parameters as shown.

Like the additional PLL200b, the additional PLL 200c is configured to generate the first reference signal $S_{REF1}$ to be provided to the main PLL100. Moreover, the additional PLL200c is a purely digital circuit.

The VCO 110 is configured to generate a ramping signal $S_{LO}$ having a frequency $F_{LO}$ that varies between 76 GHz and 81 GHz. The division ratio of the fixed frequency divider 120 is set to 1/32 and the integer values N and N+1 of the MMD 130 are set to 6 and 7, respectively. In addition, the reference frequency Fref1 of the first reference signal $S_{REF1}$ is set to 373.33 MHz by the additional PLL200c. As a result, integer N frequencies for the integer spurs nearest to the frequency range of the VCO 110 are at $F_N$ 71680 MHz (i.e., Fref1×M×N), which is 4320 MHz below the radar frequency range, and at $F_{N+1}$ 83627 MHz (i.e., Fref1×M×(N+1)), which is 2627 MHz above the radar frequency range. Thus, an integer free frequency range, including the full radar frequency range, is created such that no detectable fractional spurs are present in the radar frequency band.

The additional PLL uses a low divider value (i.e., 6) for the fixed frequency divider 270 in the reference signal path which allows a high PFD comparison frequency of 13.33 MHz to create a noise level as low as possible.

Figure 11:
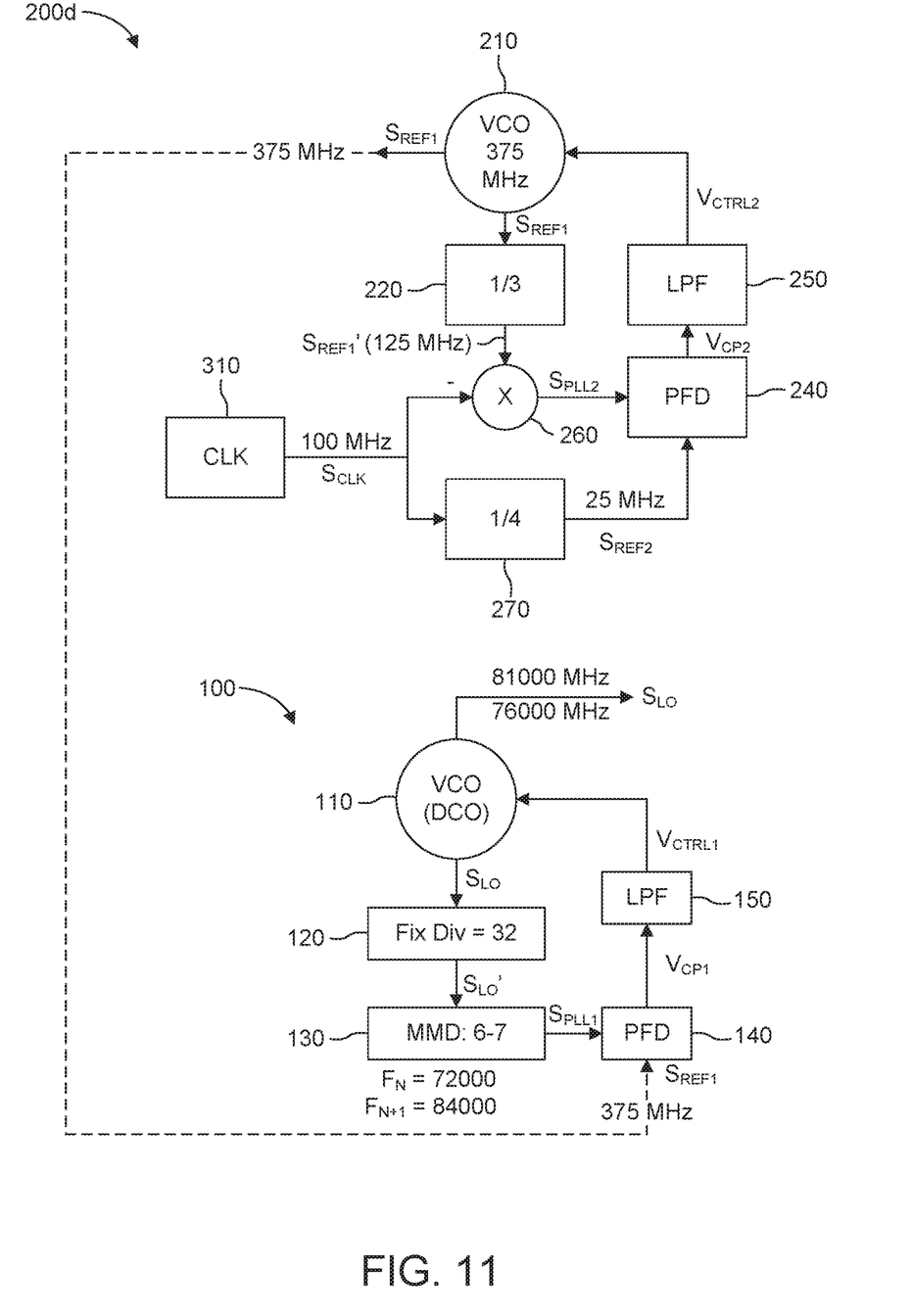
FIG. 11 shows a block diagram illustrating a signal generator according to one or more embodiments.

FIG. 11 shows a block diagram illustrating a signal generator according to one or more embodiments. In particular, the signal generator is similar to that illustrated in FIG. 9, and only differs in its parameters used for generating a constant frequency of 375 MHz for reference signal $S_{REF1}$. The signal generator includes the main PLL100 described in FIG. 6 and an additional PLL 200d. The additional PLL200d is configured in a similar manner as the additional PLL 200b, but with different parameters as shown.

Like the additional PLL200b, the additional PLL200d is configured to generate the first reference signal $S_{REF1}$ to be provided to the main PLL100. Moreover, the additional PLL 200d is a purely digital circuit.

The VCO 110 is configured to generate a ramping signal $S_{LO}$ having a frequency $F_{LO}$ that varies between 76 GHz and 81 GHz. The division ratio of the fixed frequency divider 120 is set to 1/32 and the integer values N and N+1 of the MMD 130 are set to 6 and 7, respectively. In addition, the reference frequency Fref1 of the first reference signal $S_{REF1}$ is set to 375 MHz by the additional PLL 200d. As a result, integer N frequencies for the integer spurs nearest to the frequency range of the VCO 110 are at $F_N$ 72000 MHz (i.e., Fref1×M×N), which is 4000 MHz below the radar frequency range, and at $F_{N+1}$ 84000 MHz (i.e., Fref1×M×(N+1)), which is 3000 MHz above the radar frequency range. Thus, an integer free frequency range, including the full radar frequency range, is created such that no detectable fractional spurs are present in the radar frequency band.

The additional PLL uses a low divider value (i.e., 4) for the fixed frequency divider 270 in the reference signal path which allows a high PFD comparison frequency of 25 MHz to create a noise level as low as possible.

In view of the above, an additional PLL circuit uses a system clock signal to generate a second reference signal that is in turn used to generate a first reference signal for a main PLL circuit. The system clock signal is also used by the additional PLL circuit to generate a PLL signal (e.g., PLL signal $S_{PLL2}$) that is used by its PFD for comparison with the second reference signal for maintaining the first reference signal at a constant, fixed frequency. The first reference signal, generated by the additional PLL circuit, is transmitted to the PFD of the main PLL circuit for generating the ramping signal used for the radar application.

The system clock is the same clock as the rest of system uses. As such, using an additional clock can be avoided, where an additional clock would increase overall system costs and require additional components (quartz crystal or generator) increasing system and printed circuit board (PCB) size and power consumption.

This arrangement creates an integer free frequency range and prevents Fractional N spurious inside the used frequency range with enough margin that they do not mask possible radar targets. This arrangement also increases the reference frequency for the main RF PLL, making it faster and potentially improving its noise performance. The additional PLL is a very narrow band pure digital implementation without any external components and utilizes high comparison frequency to ensure low noise performance. In addition, the implementation principle is flexible and can be easily adapted to any other system clock frequency and fixed divider values. The additional PLL is configured to generate one, single frequency (i.e., reference frequency Fref1) that is used for the entire frequency range of the radar output (i.e., the ramping signal). As such, the first reference signal is referred to as a single-frequency signal. For example, the additional PLL may be a narrow band digital ring oscillator that generates only one frequency Fref1. The implementations described above allow preventing fractional N PLL spurious by increasing the spurious free dynamic range and allows more robust detection of small targets over the whole radar frequency range available for the implemented radar application.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A signal generator, comprising:
   a first phase-locked loop (PLL) configured to receive a first reference signal having a first reference frequency and generate a ramping signal based on the first reference signal, wherein the ramping signal is between a minimum frequency and a maximum frequency of a radar frequency band;
   a system clock configured to generate a second reference signal having a common system reference frequency; and
   a second PLL configured to receive the second reference signal from the system clock, generate the first reference signal based on the second reference signal, and provide the first reference signal to the first PLL.

2. The signal generator of claim 1, wherein the first PLL is configured to generate a first PLL signal based on the ramping signal, compare the first PLL signal and the first reference signal to generate a first error signal, and generate the ramping signal based on the first error signal.

3. The signal generator of claim 2, wherein the first PLL comprises:
   a multi-modulus divider (MMD) configured to generate the first PLL signal based on the ramping signal,
   wherein the radar frequency band defined by the minimum frequency and the maximum frequency is substantially free of any fractional spurs caused by the MMD.

4. The signal generator of claim 2, wherein:
   the second PLL is configured to generate a second PLL signal based on the first reference signal and the second reference signal, generate a third reference signal based on the second reference signal, compare the second PLL signal and the third reference signal to generate a second error signal, and generate the first reference signal based on the second error signal.

5. The signal generator of claim 4, wherein:
   the first PLL comprises a negative feedback path and a multi-modulus divider (MMD) in the negative feedback path, the MMD being configured to generate the first PLL signal, and
   the radar frequency band is substantially free of any fractional spurs caused by the MMD.

6. The signal generator of claim 5, wherein the MMD is configured to generate the minimum frequency based on a first fractional value and generate the maximum frequency based on a second fractional value, wherein the first fractional value and the second fractional value are between two consecutive integers, including a lower integer and a higher integer, with a first margin between the lower integer and the first fractional value and a second margin between the second fractional value and the higher integer.

7. The signal generator of claim 6, wherein the first and second margins correspond to a frequency of at least 100 MHz in the frequency domain.

8. The signal generator of claim 4, wherein the second PLL comprises:
   a mixer configured to receive the first reference signal and the second reference signal, and generate a downmixed signal as the second PLL signal; and a first fixed frequency divider configured to receive the second reference signal and convert the second reference signal into a second frequency-reduced reference signal as the third reference signal.

9. The signal generator of claim 1, wherein:
the first PLL is configured to generate a first PLL signal based on the ramping signal, compare the first PLL signal and the first reference signal to generate a first error signal, and generate the ramping signal based on the first error signal,
the second PLL is configured to generate a second PLL signal based on the first reference signal and the second reference signal, compare the second PLL signal and the second reference signal to generate a second error signal, and generate the first reference signal based on the second error signal, and
the second PLL comprises:
a first fixed frequency divider configured to receive the first reference signal and convert the first reference signal into a first frequency-reduced reference signal; and
a mixer configured to receive the frequency-reduced reference signal and the second reference signal, and generate a down-mixed signal as the second PLL signal.

10. The signal generator of claim 4, wherein the second PLL comprises:
a first controlled oscillator configured to generate the first reference signal based on a first control signal;
a mixer configured to receive the first reference signal and the second reference signal, and generate a down-mixed signal as the second PLL signal;
a first fixed frequency divider configured to receive the second reference signal and convert the second reference signal into a second frequency-reduced reference signal as the third reference signal;
a first phase frequency detector (PFD) configured to generate the second error signal by comparing the second PLL signal and the third reference signal; and
a first loop filter configured to generate the first control signal based on the second error signal.

11. The signal generator of claim 1, wherein:
the first PLL is configured to generate a first PLL signal based on the ramping signal, compare the first PLL signal and the first reference signal to generate a first error signal, and generate the ramping signal based on the first error signal,
the second PLL is configured to generate a second PLL signal based on the first reference signal and the second reference signal, compare the second PLL signal and the second reference signal to generate a second error signal, and generate the first reference signal based on the second error signal, and
the second PLL comprises:
a first controlled oscillator configured to generate the first reference signal based on a first control signal;
a first fixed frequency divider configured to receive the first reference signal from the first controlled oscillator and convert the first reference signal into a first frequency-reduced reference signal;
a mixer configured to receive the frequency-reduced reference signal and the second reference signal, and generate a down-mixed signal as the second PLL signal;

a first phase frequency detector (PFD) configured to generate the second error signal by comparing the second PLL signal and the second reference signal; and
a first loop filter configured to generate the first control signal based on the second error signal.

12. The signal generator of claim 1, wherein the second PLL is an entirely digital circuit.

13. The signal generator of claim 12, wherein the second PLL is configured to output a single-frequency signal, wherein the single-frequency signal is the first reference signal.

14. The signal generator of claim 1, wherein the ramping signal is a frequency-modulated continuous-wave (FMCW) radar signal.

15. A method of preventing fractional spurs inside a radar frequency band having a frequency range including a minimum frequency and a maximum frequency, the method comprising:
generating, by a first phase-locked loop (PLL), a ramping signal within the radar frequency band based on a first reference signal;
generating, by a system clock, a second reference signal having a common system reference frequency;
generating, by a second PLL, the first reference signal based on the second reference signal; and
transmitting, by the second PLL, the first reference signal to the first PLL.

16. The method of claim 15, further comprising:
generating, by the first PLL, a first PLL signal based on the ramping signal;
generating, by the first PLL, a first error signal by comparing the first PLL signal and the first reference signal; and
generating, by the first PLL, the ramping signal based on the first error signal.

17. The method of claim 16, further comprising:
generating, by a multi-modulus divider (MMD) of the first PLL, the first PLL signal based on the ramping signal,
wherein the radar frequency band is substantially free of any fractional spurs caused by the MMD.

18. The method of claim 17, further comprising:
generating, by the MMD of the first PLL, the minimum frequency based on a first fractional value; and
generating, by the MMD of the second PLL, the maximum frequency based on a second fractional value,
wherein the first fractional value and the second fractional value are between two consecutive integers, including a lower integer and a higher integer, with a first margin between the lower integer and the first fractional value and a second margin between the second fractional value and the higher integer.

19. The signal generator of claim 18, wherein the first and second the margins correspond to a frequency of at least 100 MHz in the frequency domain.

20. The method of claim 16, further comprising:
generating, by the second PLL, a second PLL signal based on the first reference signal and the second reference signal;
generating, by the second PLL, a third reference signal based on the second reference signal;
generating, by the second PLL, a second error signal by comparing the second PLL signal and the third reference signal; and
generating, by the second PLL, the first reference signal based on the second error signal.

21. The method of claim 20, further comprising:
generating, by a mixer of the second PLL, a down-mixed signal as the second PLL signal based on the first reference signal and the second reference signal; and
converting, by a first fixed frequency divider of the second PLL, the second reference signal into a second frequency-reduced reference signal as the third reference signal.

22. The method of claim 20, further comprising:
generating, by a first controlled oscillator of the second PLL, the first reference signal based on a first control signal;
generating, by a mixer of the second PLL, a down-mixed signal as the second PLL signal based on the first reference signal and the second reference signal; and
converting, by a first fixed frequency divider of the second PLL, the second reference signal into a second frequency-reduced reference signal as the third reference signal;
generating, by a first phase frequency detector (PFD) of the second PLL, the second error signal by comparing the second PLL signal and the third reference signal; and
generating, by a first loop filter of the second PLL, the first control signal based on the second error signal.

23. The method of claim 16, further comprising:
generating, by the second PLL, a second PLL signal based on the first reference signal and the second reference signal;
generating, by the second PLL, a second error signal by comparing the second PLL signal and the second reference signal; and
generating, by the second PLL, the first reference signal based on the second error signal.

24. The method of claim 23, further comprising:
converting, by a first fixed frequency divider of the second PLL, the first reference signal into a first frequency-reduced reference signal; and
generating, by a mixer of the second PLL, a down-mixed signal as the second PLL signal based on the frequency-reduced reference signal and the second reference signal.

25. The method of claim 23, further comprising:
generating, by a first controlled oscillator of the second PLL, the first reference signal based on a first control signal;
converting, by a first fixed frequency divider of the second PLL, the first reference signal into a first frequency-reduced reference signal;
generating, by a mixer of the second PLL, a down-mixed signal as the second PLL signal based on the frequency-reduced reference signal and the second reference signal;
generating, by a first phase frequency detector (PFD) of the second PLL, the second error signal by comparing the second PLL signal and the second reference signal; and
generating, by a first loop filter of the second PLL, the first control signal based on the second error signal.

26. A radar signal generator, comprising:
a first phase-locked loop (PLL) configured to receive a first reference signal having a first reference frequency and generate a radar ramping signal based on the first reference signal, wherein the radar ramping signal varies between two radar frequencies that are in a radar frequency band defined by a minimum radar frequency and a maximum radar frequency;
a system clock configured to generate a second reference signal having a common system reference frequency; and
a second PLL configured to receive the second reference signal from the system clock, generate the first reference signal based on the second reference signal, and provide the first reference signal to the first PLL.

* * * * *